(12) United States Patent
Harvilchuck et al.

(10) Patent No.: US 9,736,959 B2
(45) Date of Patent: Aug. 15, 2017

(54) CABLE MANAGEMENT SYSTEMS

(71) Applicant: Xyratex Technology Limited, Havant (GB)

(72) Inventors: Laurence Harvilchuck, Brackney, PA (US); Alexander C. Worrall, Waterlooville (GB)

(73) Assignee: Xyratex Technology Limited, Havant (GB)

( * ) Notice: Subject to any disclaimer, the term of this patent is extended or adjusted under 35 U.S.C. 154(b) by 51 days.

(21) Appl. No.: 14/733,500

(22) Filed: Jun. 8, 2015

(65) Prior Publication Data
US 2016/0360637 A1    Dec. 8, 2016

(51) Int. Cl.
*H05K 7/14* (2006.01)
*F16L 3/015* (2006.01)
*F16L 3/26* (2006.01)

(52) U.S. Cl.
CPC ............ *H05K 7/1491* (2013.01); *F16L 3/015* (2013.01); *F16L 3/26* (2013.01)

(58) Field of Classification Search
CPC ......... H05K 7/14; H05K 7/1491; F16L 3/015; F16L 3/26; A44B 19/00; H02G 3/04; H02G 3/0437; H02G 11/00; H02G 11/006; H02G 3/128
USPC .......................................................... 211/26
See application file for complete search history.

(56) References Cited

U.S. PATENT DOCUMENTS

| | | | | |
|---|---|---|---|---|
| 3,630,325 | A * | 12/1971 | Corl .................... | H02G 11/006 191/12 C |
| 3,647,936 | A * | 3/1972 | Dryg .................... | H02G 11/006 174/69 |
| 3,710,199 | A * | 1/1973 | Cignoni, Jr. ......... | H05K 7/1491 174/DIG. 9 |
| 3,792,189 | A * | 2/1974 | Stengel ............... | H02G 3/0437 174/69 |
| 5,949,026 | A * | 9/1999 | DeFlorio ............. | H01B 7/0807 174/117 R |
| 6,327,139 | B1 * | 12/2001 | Champion ............ | H02B 1/202 174/69 |
| 6,501,020 | B2 * | 12/2002 | Grant ................... | H02G 3/0456 174/50 |
| 6,944,383 | B1 | 9/2005 | Herzog et al. | |
| 7,092,258 | B2 * | 8/2006 | Hardt ................... | H02B 1/36 361/727 |
| 7,184,271 | B2 * | 2/2007 | Watanabe ............ | G11B 33/126 174/50 |
| 7,472,795 | B2 * | 1/2009 | Dubon .................. | H02G 3/128 211/26 |
| 7,822,311 | B2 * | 10/2010 | Stansbury ............ | G02B 6/4452 175/50 |
| 8,169,794 | B2 * | 5/2012 | Matsukawa ........... | H02G 11/00 174/117 F |
| 8,455,758 | B2 | 6/2013 | Groset et al. | |

(Continued)

*Primary Examiner* — Korie H Chan
(74) *Attorney, Agent, or Firm* — Mueting, Raasch & Gebhardt, P.A.

(57) ABSTRACT

Cable management systems for use with a chassis includes a device holding apparatus, a device holding apparatus track, a chassis track and a cable carrier. The cable carrier may carry one or more cables and engage a portion of each of the chassis track and the device holding apparatus track when the device holding apparatus is in, or being moved between, a first position and a second position.

16 Claims, 8 Drawing Sheets

(56) References Cited

U.S. PATENT DOCUMENTS 9,173,312 B1* 10/2015 Jau ..................... G11B 33/126
2008/0029288 A1* 2/2008 Chen ..................... A41D 1/005
174/68.3

* cited by examiner

CABLE MANAGEMENT SYSTEMS

SUMMARY

The present disclosure relates to managing one or more cables (e.g., cords, wires, fiber cables, any type of flexible connecting apparatus, any signal transmitting cable, pipes, tubes, conduit, etc.) located on a device holding apparatus (e.g., a shelf, a drawer, rails, etc.) that moves relative to a chassis (e.g., a server rack, a structure, etc.). In at least one embodiment, the one or more cables is carried along a cable carrier that is configured to move synchronously with the device holding apparatus to provide a consistent positioning of the one or more cables.

An exemplary cable management system may include a device holding apparatus, a device holding apparatus track, a chassis track, and a cable carrier. The device holding apparatus may be movably coupled to a chassis and movable between an open position and a closed position. The device holding apparatus track may be coupled to the device holding apparatus and define a holding track length and the chassis track may be coupled to the chassis and define a chassis track length. The cable carrier may be configured to carry a cable, be engaged to a portion of the chassis track along at least half of the chassis track length when the device holding apparatus is in the open position, and be engaged to a portion of the device holding apparatus track along at least half of the holding track length when the device holding apparatus is in the closed position.

Another exemplary cable management system may include a device holding apparatus (e.g., a data storage device holder), a device holding apparatus track (e.g., a data storage device holder track), a chassis track, and a cable carrier. The device holding apparatus (e.g., a data storage device holder) may be movably coupled to a chassis and movable between an open position and a closed position. The device holding apparatus track (e.g., a data storage device holder track) may be coupled to the device holding apparatus (e.g., a data storage device holder) and the chassis track may be coupled to the chassis. The cable carrier may extend from a first cable carrier end region to a second cable carrier end region and be configured to carry a cable. The first cable carrier end region may maintain a first position relative to the chassis and the second cable carrier end region may maintain a second position relative to the device holding apparatus (e.g., a data storage device holder) when the device holding apparatus (e.g., a data storage device holder) moves between and is in the open and closed positions. The first cable carrier end region may be closer to the second cable carrier end region when the device holding apparatus (e.g., a data storage device holder) is in the closed position than when in the open position.

Another exemplary cable management system may include a device holding apparatus track, a chassis track and a cable carrier. The device holding apparatus track may be coupled to a device holding apparatus that is movably coupled (e.g., between an open and closed position) to a chassis. The chassis track may be coupled to the chassis. The cable carrier may be configured to carry one or more cables from a first cable carrier end region to a second cable carrier end region. A first length of the cable carrier that is engaged to the chassis track increases while a second length of the cable carrier that is disengaged from the device holding apparatus track simultaneously increases when the device holding apparatus moves from the closed position to the open position.

Yet another exemplary cable management system may include a device holding apparatus track, a chassis track, and a cable carrier. The device holding apparatus track may be coupled to a device holding apparatus, extend from a first holding track end region to a second holding track end region, and define a holding track length and the chassis track may be coupled to the chassis and define a chassis track length. The device holding apparatus may be movably coupled to a chassis and movable between a first position and a second position. The cable carrier may be configured to carry a cable, be engaged to a portion of the chassis track along at least half of the chassis track length when the device holding apparatus is in the first position, and be engaged to a portion of the device holding apparatus track along at least half of the holding track length when the device holding apparatus is in the second position.

An exemplary method may include providing a device holding apparatus track coupled to a device holding apparatus and a chassis track coupled to a chassis. The method may further include providing a cable carrier extending from a first cable carrier end region to a second cable carrier end region and configured to carry a cable from the first cable carrier end region to the second cable carrier end region. At least a portion of the device holding apparatus may be located farther from the chassis in an open position than in a closed position. The method may also include increasing a first length of the cable carrier that is engaged to the chassis track when the device holding apparatus moves from the closed position to the open position and simultaneously increasing a second length of the cable carrier that is disengaged from the device holding apparatus track when the device holding apparatus moves from the closed position to the open position.

The above summary is not intended to describe each embodiment or every implementation of the present disclosure. A more complete understanding will become apparent and appreciated by referring to the following detailed description and claims taken in conjunction with the accompanying drawings. In other words, these and various other features and advantages will be apparent from a reading of the following detailed description.

DETAILED DESCRIPTION

Figure 1:
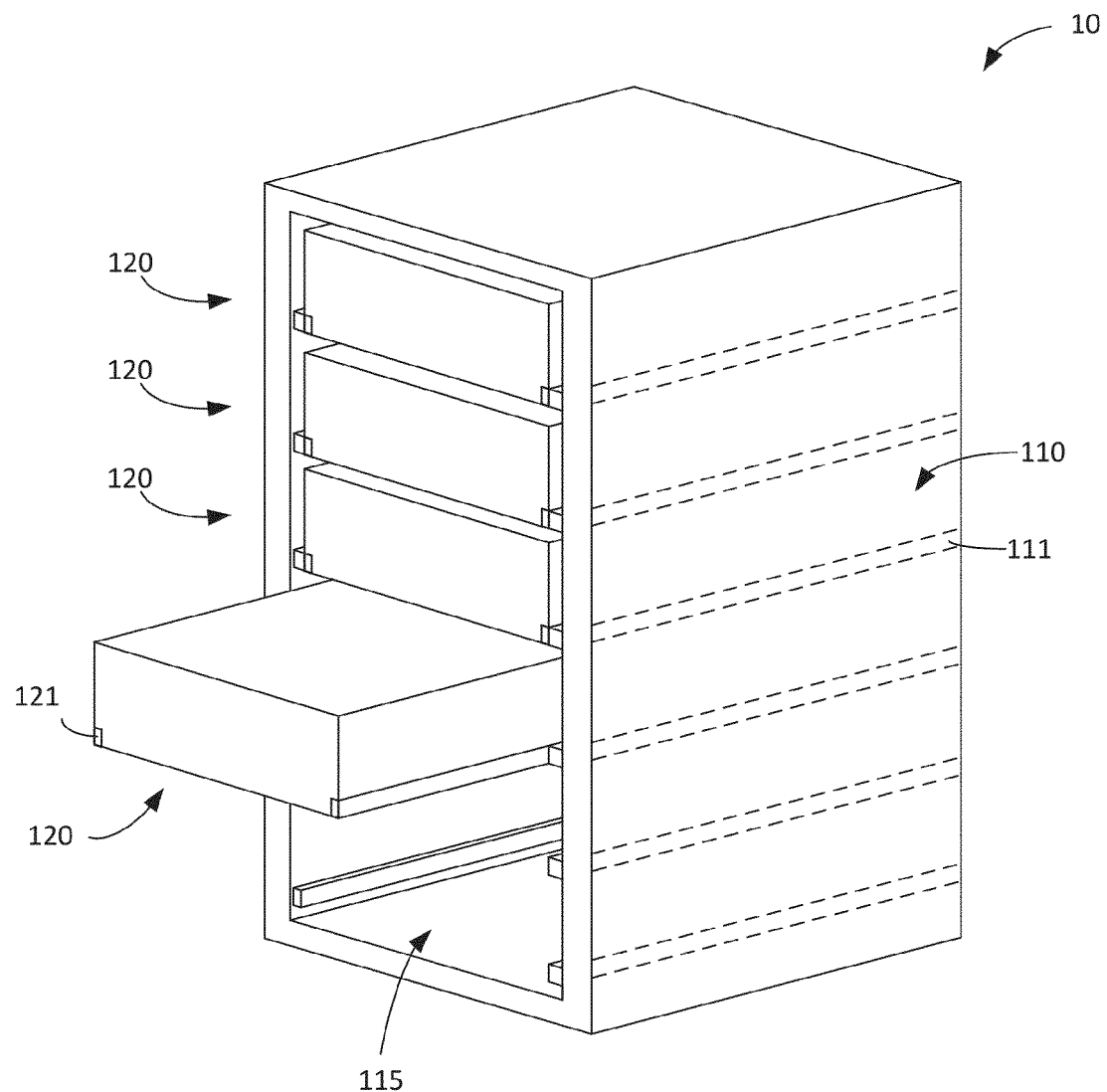
FIG. 1 is a perspective view of a device holding system.

The disclosure herein relates to cable management systems for carrying one or more cables in a device holding apparatus (e.g., a data storage device holder) that moves relative to a structure, including an enclosure in some embodiments. The structure may include components (e.g., drawers) that are moveable relative to the structure and are configured to hold or support one or more devices. For example, one or more devices (e.g., electronics, etc.) may be positioned on or coupled to the moveable components and may be coupled to one or more cables. The one or more cables may include, e.g., fiber optic cables, power cables, serial cables, serially-attached SCSI cables, Ethernet cables, wires, cords, any type of flexible connecting apparatus, pipes, hoses, conduit, etc. For example, the one or more devices may be coupled to one or more cables that are configured to transmit signals (e.g., electrical signals, network signals, data signals, optical signals, power signals, etc.) or fluid (e.g., liquids, gases, etc. for cooling, heating, hydraulics, etc.). In at least one embodiment, the structure may be a server or data center "rack" or similar apparatus configured to hold a plurality of computer servers, networking equipment, etc., each of such devices having at least one power cord coupled thereto configured to provide power to the device and possibly at least one signal-carrying cable coupled thereto configured to provide data signals into and out of the device.

One or more cables of devices located on or held by the moveable component may be problematic when the moveable component is moved relative to the structure. For example, the one or more cables may be cumbersome when moving the moveable component (e.g., cable slack may move undesirably). Specifically, the one or more cables may, e.g., become tangled, become disconnected from the one or more devices, restrict the moveable component and/or one or more devices from moving properly, become caught in the moveable component, drag a device, damage a socket or port of the one or more devices by placing increased forces on the socket/port, become damaged, pull a device off of the movable component, damage other materials proximate the one or more cables, constrain fluid flow, etc.

The present disclosure includes an apparatus to provide effective cable management for such aforementioned structures, moveable components, and one or more devices. For example, a cable management system, described herein, may direct and carry one or more cables to, e.g., keep the one or more cables from becoming tangled, maintain a position of the one or more cables, help prevent the one or more cables from becoming disconnected, help the moveable component move freely without undue inhibition from one or more cables, prevent damage to the one or more cables, prevent damage to cable sockets, prevent kinking or distorting or crushing, prevent damage to any material surrounding one or more conductors/wires within the one or more cables (e.g., foam or plastic that provides correct spacing between conductors within the one or more cables), etc. The exemplary cable management systems may also be described as designed to strike a balance amongst serviceability, mechanical integrity, ease of use, and cost. The exemplary cable management systems described herein may be configured to have, e.g., the ability to avoid the use of a commercial cable track solution, reduced cost, a minimum of free cable resident in enclosures, effective managing drawer/tray/layer cables, etc.

The one or more devices of the exemplary cable management systems described herein may include data storage devices such as, e.g., hard disk drives (HDDs), solid state drives (SSDs), etc. Such data storage devices may be located within enclosures to be used in and/or by the exemplary cable management systems described herein. For example, the one or more devices such as data storage devices may be positioned relative to the moveable components and in communication with another of the one or more devices or some external sources. In one or more embodiments, the combination of multiple data storage devices (e.g., HDDs, SSDs, etc.) may form at least part of the server or data center "rack." Further, the one or more devices may include one or more computing devices such as, e.g., servers, cloud computing computers, etc.

Exemplary systems, apparatus, and devices shall be described with reference to FIGS. 1-5. It will be apparent to one skilled in the art that elements or processes from one embodiment may be used in combination with elements or processes of the other embodiments, and that the possible embodiments of such systems, apparatus, and devices using combinations of features set forth herein is not limited to the specific embodiments shown in the figures and/or described herein. Further, it will be recognized that timing of the processes and the size and shape of various elements herein may be modified but still fall within the scope of the present disclosure, although certain timings, one or more shapes and/or sizes, or types of elements, may be advantageous over others.

The exemplary cable management systems described herein include a cable carrier that may be described as being configured to help manage cable slack and provide appropriate positioning of one or more cables coupled to devices regardless of where the moveable component, and in turn, the devices, are relative to the structure (e.g., in an open position, in a closed position, or anywhere in between). For example, one or more cables may be carried through an exemplary cable carrier in the structure from a first region to a second region. The first region of the cable carrier may be configured to maintain a first position relative to the structure and the second region of the cable carrier may be configured to maintain a second position relative to a moveable component when the moveable component moves relative to the structure. Since the device moves with the moveable component and the second region of the cable carrier maintains the second position relative to the moveable component, the cables carried by the cable carrier extending from the second region to the devices will be relatively stationary (e.g., so as to not provide any stress on the cable sockets of the device, so as to not move the device, etc.).

For example, it may be described that the second region of the cable carrier may provide a constant distance to devices on the moveable component for which the second region of the cable carrier maintains a position relative to and the first region of the cable carrier may provide a constant distance to, e.g., devices on a different moveable component of the structure, a wall, the ground, a separate structure, etc. This allows the moveable component to slide towards and away from the structure without putting stress on the cable because these distances remain constant and, therefore, e.g., reducing the possibility of the cable being problematic.

An exemplary device holding system 10 may include a chassis 110 and a plurality of device holding apparatus (e.g., a data storage device holder) 120 as shown in FIG. 1. The chassis 110 may be a structure that is positioned on top of a ground surface and/or proximate a wall. For example, the chassis 110 may be anchored to the ground surface, moveable across the ground surface, mounted to the wall, etc. Further, the chassis 110 may be a variety of different shapes, sizes, and for a variety of applications. For example, the chassis 110 may be a rack system (e.g., a server rack), 2U/3U/4U/5U/6U or more mount, frame, an enclosure (e.g., a 5U84 drive enclosure), a stationary structure that has an apparatus (e.g., machinery) moving relative to the structure, etc. In one or more embodiments, the chassis 110 may be used with, e.g., robotics or moving machinery to help control excess cable located between the same.

The chassis 110 may contain a region 115, e.g., a cavity in the embodiment in FIG. 1, in which the plurality of device holding apparatus (e.g., a plurality of data storage device holders) 120 may be positioned. For example, the plurality of device holding apparatus 120 may be moveably coupled to the chassis 110 such that the plurality of device holding apparatus 120 move relative to the chassis 110 (e.g., into and out of the region 115). The plurality of device holding apparatus 120 may move relative to the chassis in any suitable way, e.g., between an open position (e.g., first position) and a closed position (e.g., second position). In operation, the devices holding apparatus 120 may be described as being similar to a drawer.

As shown, the region 115 may be described as at least partially containing the plurality of device holding apparatus 120 when the plurality of device holding apparatus 120 are in the closed position. In one or more embodiments, the plurality of device holding apparatus 120 may occupy the majority of the region 115. Further, in other embodiments, e.g., as shown in FIG. 1, there may be regions of the chassis cavity 115 that do not contain a device holding apparatus 120. In at least one embodiment, the chassis may include a door configured to close the region 115 when the plurality of device holding apparatus 120 are in the closed position.

The plurality of device holding apparatus 120 may be arranged in a variety of different ways. As shown in FIG. 1, the plurality of device holding apparatus 120 may be described as being positioned in a vertical stack within the chassis 110. In other embodiments, the plurality of holding apparatus 120 may be arranged in, e.g., multiple vertical columns, multiple horizontal rows, a grid of rows and columns, etc.

Each of the plurality of device holding apparatus 120 may be configured to hold, or position, one or more devices (e.g., an electronic device, a server, a switch, a router, a networking device, etc.) in relation to the device holding apparatus 120 such that, e.g., the chassis 110 can hold a plurality of devices, and the device holding apparatus 120 can facilitate the movement of the devices. For example, one or more devices may be mounted on, or coupled to, one of the plurality of device holding apparatus 120 (e.g., device 104 shown in FIGS. 2 and 4). In one or more embodiments, each of the plurality of device holding apparatus 120 may be, e.g., a drawer, a shelf, a rack, a tray, a layer, a set of rails attached to a device, etc. Generally, the device holding apparatus 120 may be described as any suitable one or more parts and/or portions that may be configured to provide a structure to hold and/or support a device.

As described herein, the plurality of device holding apparatus (e.g., the data storage device holders) 120 are moveably coupled to the chassis 110, e.g., to provide better accessibility to the items positioned on the device holding apparatus 120 and supported by the chassis 110. For example, each of the plurality of device holding apparatus 120 may be independently moveably coupled to the chassis 110. As shown in FIG. 1, each of the plurality of device holding apparatus 120 is configured to move similar to a drawer, e.g., into and out of the region 115 of the chassis 110. For example, it may be described that at least a portion of the device holding apparatus 120 moves away from the chassis 110 to provide better access to the at least a portion of the device holding apparatus 120. Specifically, the plurality of device holding apparatus 120 may be configured such that at least a portion of each of the plurality of device holding apparatus 120 moves away from and/or out of the region 115 as well as towards and/or into the region 115.

Each of the devices (e.g., data storage devices, HDDs, SSDs, etc.) held by the device holding apparatus (e.g., a data storage device holder) 120 may be coupled to one or more cables that may extend between, e.g., the device and a power source, two or more devices, the device and a wall socket or jack, etc. In one or more embodiments, one end of a cable may be located on the chassis 110 at a position from which the device holding apparatus 120 moves away from the chassis 110, while the other end of the cable may be located on the device holding apparatus 120 proximate the device. When the device holding apparatus 120 moves out of the region 115, a gap forms within the chassis 110 in the volume that was previously occupied by the device holding apparatus 120. For example, the gap is between the device holding apparatus 120 and a back wall of the chassis 110 in the region 115. The size of the gap increases as the device holding apparatus 120 moves out of the region 115. As described, each device that is positioned on, or held by, any of the plurality of device holding apparatus 120 may be configured to move along with the corresponding device holding apparatus 120 when the device holding apparatus 120 moves relative to the chassis 110. Thus, the gap increases the distance by which one or more cables, coupled to a device positioned on the device holding apparatus 120, may have to traverse between the device holding apparatus 120 and the chassis 110, and therefore, the one or more cables may be managed by the exemplary cable management systems described herein.

Further, the plurality of device holding apparatus 120 may be moveably coupled to the chassis 110 in any suitable way that allows for each of the plurality of device holding apparatus 120 to move relative to the chassis 110. In the embodiment shown, the device holding system 10 may include a rail system on which each of the plurality of device holding apparatus 120 slides relative to the chassis 110. In one or more embodiments, the rail system may be the device holding apparatus 120 itself (e.g., in its entirety). In one or more embodiments, each of the plurality of device holding apparatus 120 may include a separate rail system between each of the plurality of device holding apparatus 120 and the chassis 110, such that each of the plurality of device holding apparatus 120 moves independently from one another. In another embodiment, one rail system may be configured to move all of the plurality of device apparatus 120 at the same time.

In at least the embodiment of a rail system shown in FIG. 1, each device holding apparatus 120 may include a chassis rail 111 coupled to the chassis 110 and a device holding rail 121 coupled to the one or more devices or a platform of the device holding apparatus 120. The chassis rail 111 may be movable coupled to the device holding rail 121 to support the one or more devices (e.g., upon which one or more devices may lie or be supported and/or any other portion of the device holding apparatus 120 configured to support one or more devices) while also allowing the device holding rail 121 to move relative to the chassis rail 111. As shown in FIG. 1, each of the plurality of device holding apparatus 120 include two device holding rails 121 on opposing sides and the two device holding rails 121 interact with two corresponding chassis rails 111.

As the device holding apparatus 120 moves relative to the chassis 110, the one or more cables connected to a device positioned on the device holding apparatus 120 may experience undesired forces due to movement of the device holding apparatus 120. An exemplary cable management system as described herein may help guide the one or more cables to prevent any potential cable problems (e.g., entanglement, disconnection, undue stress, etc.) associated with the movement of the device holding apparatus 120.

An exemplary cable management system 100 for use with a chassis 110 is shown in FIGS. 2-5. As discussed herein, the cable management system 100 may include a device holding apparatus 120 that is movably coupled to the chassis 110. The device holding apparatus 120 may be a variety of shapes, forms, and sizes. For example, the device holding apparatus 120 may include, e.g., a drawer, a rack, a shelf, a bar, rails, a tray, a layer, etc. In other words, the device holding apparatus 120 may be any form that allows the device holding apparatus 120 to be movably coupled to the chassis 110 and configured in any suitable way to support or hold a device. As shown in FIGS. 2-4, the device holding apparatus 120 is a planar shelf-like surface upon which one or more devices may rest. Similarly, the chassis 110 is illustrated as a planar shelf-like surface to help depict the arrangement of the cable management system 100 in one or more embodiments.

As described herein, the device holding apparatus (e.g., a data storage device holder) 120 may be movably coupled to the chassis 110 such that the device holding apparatus 120 may move relative to the chassis 110. As shown, the device holding apparatus 120 is movable between an open, or first, position (see, e.g., FIGS. 2B, 3C, and 4B), a closed, or second, position (see, e.g., FIGS. 2A, 3A, and 4A), and anywhere therebetween. When the device holding apparatus 120 is in an open, or first, position, the device holding apparatus may be, e.g., at least partially away from the chassis 110 and more accessible to a user, and when the device holding apparatus 120 is in a closed, or second, position, the device holding apparatus may be, e.g., obstructed by the chassis 110 or other device holding apparatus 120 and less accessible to a user.

Figure 3A:
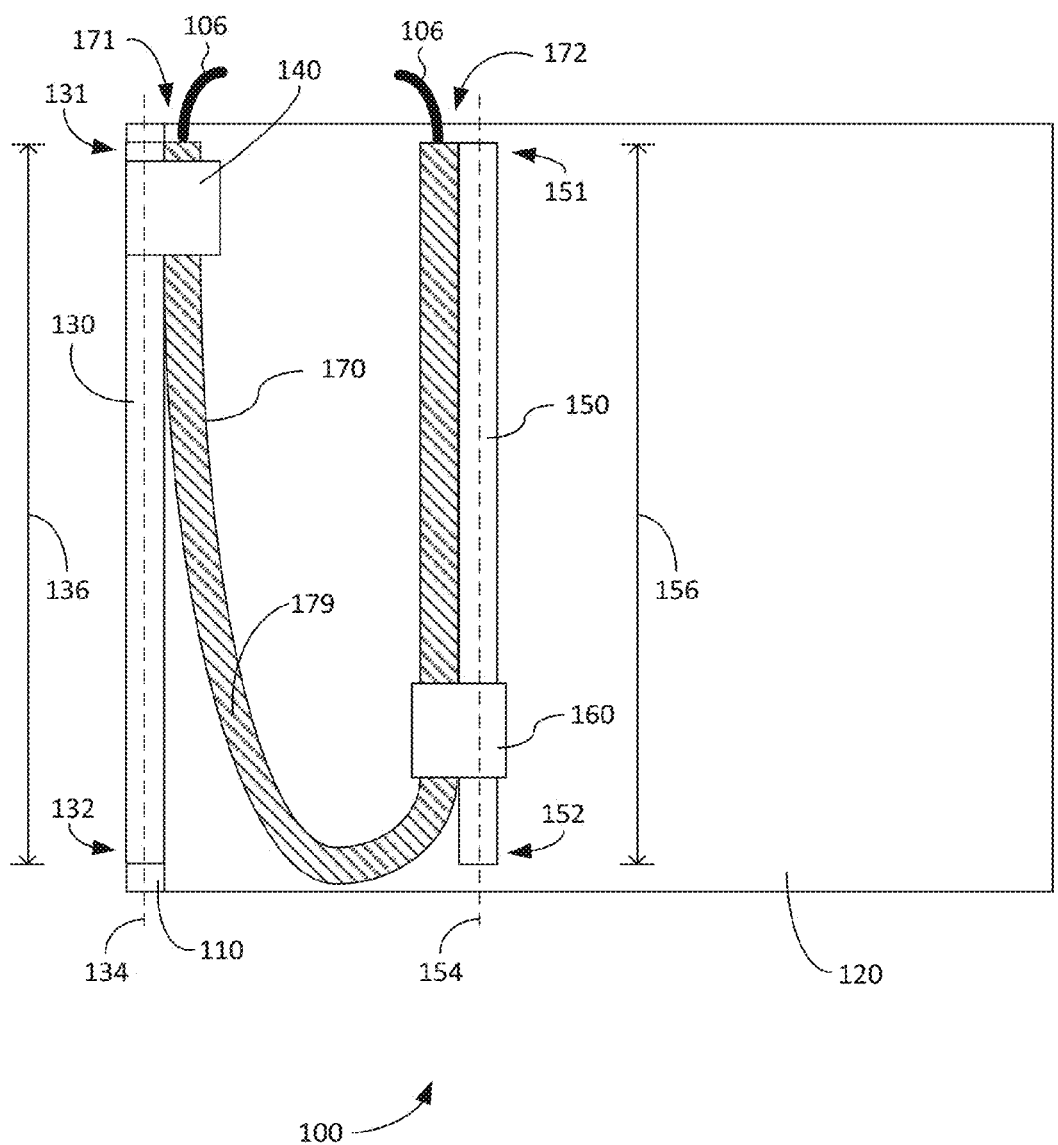
FIG. 3A is a top view of the cable management system of FIG. 2A when the device holding apparatus is in the closed position.
Figure 3B:
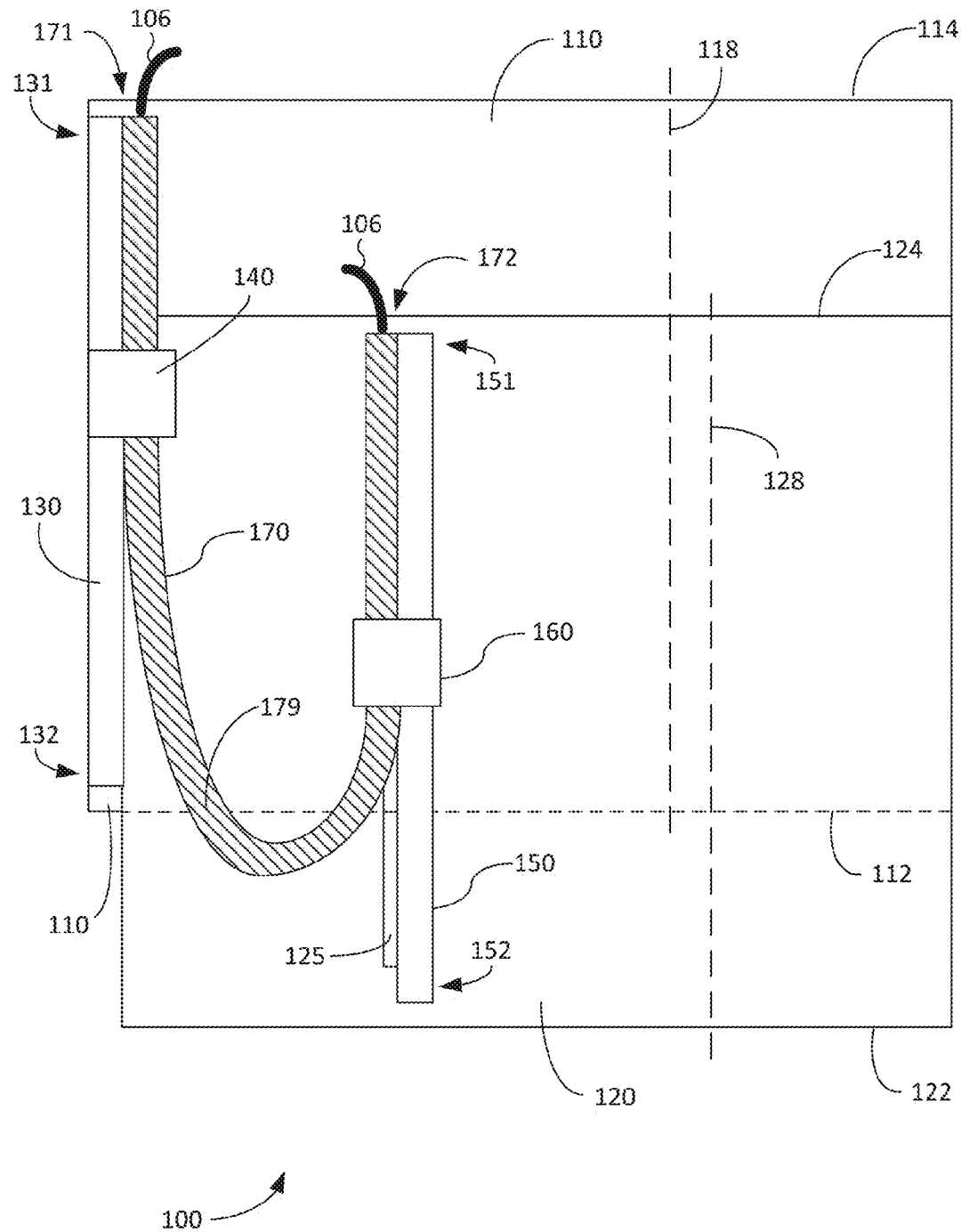
FIG. 3B is a top view of the cable management system of FIG. 2A when the device holding apparatus is in between the closed position and the open position.

In one or more embodiments, the open position (e.g., the first position) may be defined as at least a portion of the device holding apparatus 120 being located farther from the chassis 110 when the device holding apparatus 120 is in the open position than when the device holding apparatus 120 is in the closed position. Conversely, the closed position (e.g., the second position) may be defined as at least a portion of the device holding apparatus 120 being located closer to the chassis 110 when the device holding apparatus 120 is in the closed position than when the device holding apparatus 120 is in the open position. As described, the device holding apparatus 120 is also configured to move from the open, or first, position to the closed, or second, position and from the closed, or second, position to the open, or first, position. Additionally, the device holding apparatus 120 may also be positioned anywhere between the open, or first, and closed, or second, positions, e.g., as shown in FIG. 3B when the device holding apparatus 120 is in an intermediate position.

An exemplary cable management system 100 may include a device holding apparatus track (e.g., a data storage device holder track) 150 coupled to the device holding apparatus 120, a chassis track 130 coupled to the chassis 110, and a cable carrier 170 configured to carry one or more cables (e.g., cable 106 as shown in FIGS. 2-4). As described herein, the cable carrier 170 may be described as being configured to help manage cable slack and provide appropriate positioning of one or more cables coupled to devices regardless of where the moveable component. To provide such functionality, the cable carrier 170 may be configured to engage and disengage portions of the device holding apparatus track (e.g., a data storage device holder track) 150 and the chassis track 130 as the device holding apparatus 120 moves between the open and closed positions (e.g., in this way, the cable carrier 170, and thus, the cables carried thereby, is located in a predictable location and manner when the device holding apparatus 120 is located in various positions).

As shown in FIGS. 2-3, the device holding apparatus track 150, the chassis track 130, and the cable carrier 170 are positioned above the device holding apparatus 120 (e.g., the device holding apparatus 120 is located between the device holding apparatus track 150/chassis track 130/cable carrier 170 and a ground surface). In other embodiments, the device holding apparatus track 150, the chassis track 130, and the cable carrier 170 may be positioned on an underside of the device holding apparatus 120 (e.g., the device holding apparatus track 150/chassis track 130/cable carrier 170 is located between the device holding apparatus 120 and a ground surface).

The device holding apparatus track (e.g., a data storage device holder track) 150 may be described as being fixedly coupled to the device holding apparatus 120 such that the device holding apparatus track 150 does not move relative to the device holding apparatus 120. For example, the device holding apparatus track 150 may be coupled to the device holding apparatus 120 such that the device holding apparatus track 150 maintains a position relative to the device holding apparatus 120 when the device holding apparatus 120 is moved relative to the chassis 110. Further, the device holding apparatus track 150 may be described as extending from a first holding track end region 151 to a second holding track end region 152. The distance from the first holding track end region 151 to the second holding track end region 152 may define a holding track length 156.

The chassis track 130 may be described as being fixedly coupled to the chassis 110 such that the chassis track 130 does not move relative to the chassis 110. For example, the chassis track 130 may be coupled to the chassis 110 such that the chassis track 130 maintains a position relative to the chassis 110 when the device holding apparatus 120 is moved relative to the chassis 110. Further, the chassis track 130 may be described as extending from a first chassis track end region 131 to a second chassis track end region 132. The distance from the first chassis track end region 131 to the second chassis track end region 132 may define a chassis track length 136.

Figure 2A:
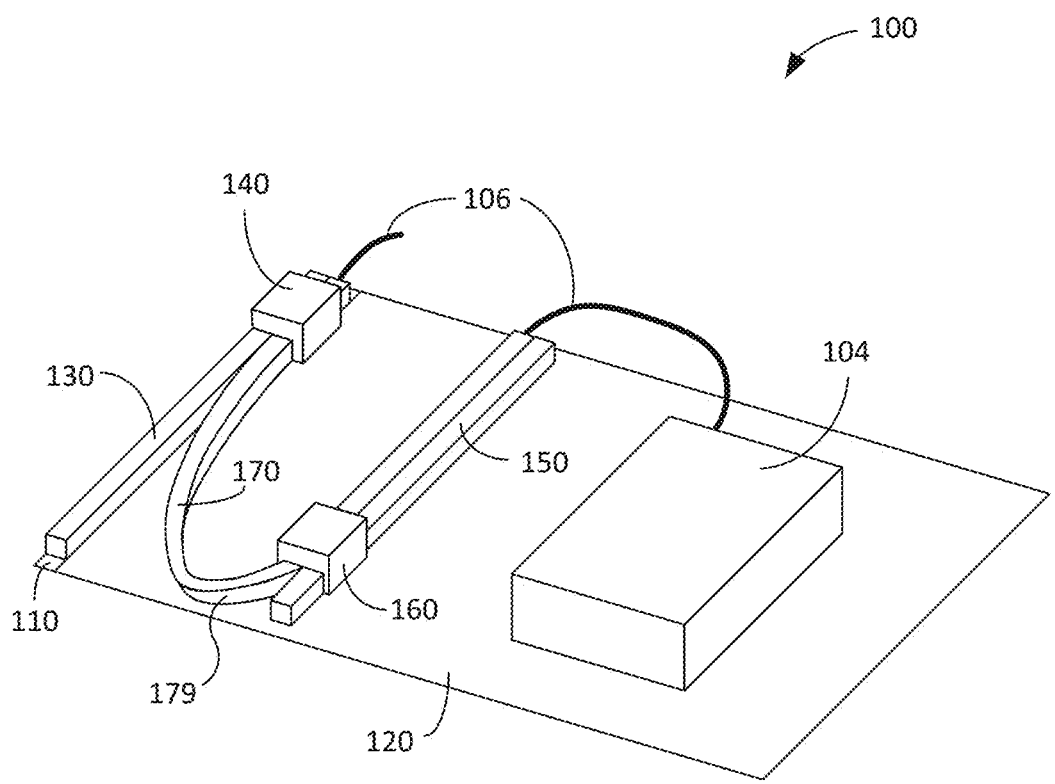
FIG. 2A is a perspective view of an exemplary cable management system used with a device holding apparatus, e.g., of the device holding system of FIG. 1, when the device holding apparatus is in a closed position.
Figure 2B:
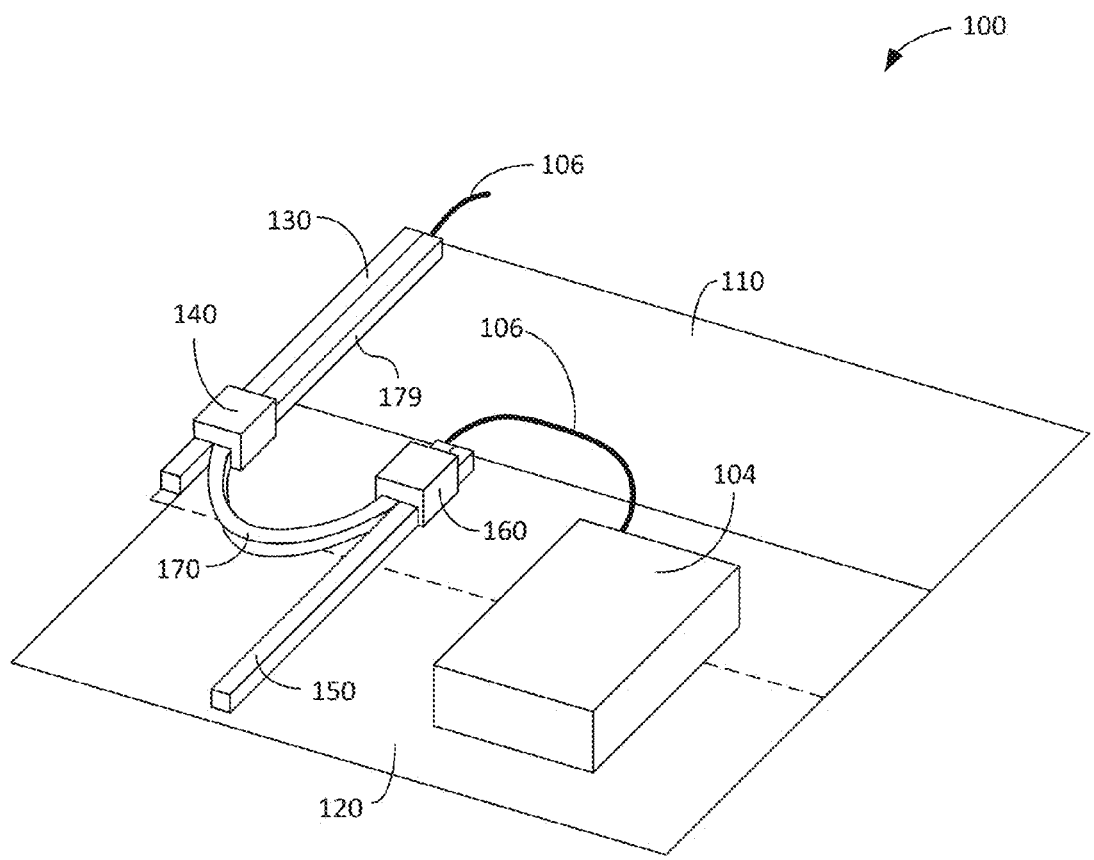
FIG. 2B is a perspective view of the cable management system of FIG. 2A when the device holding apparatus is in an open position.
Figure 4A:
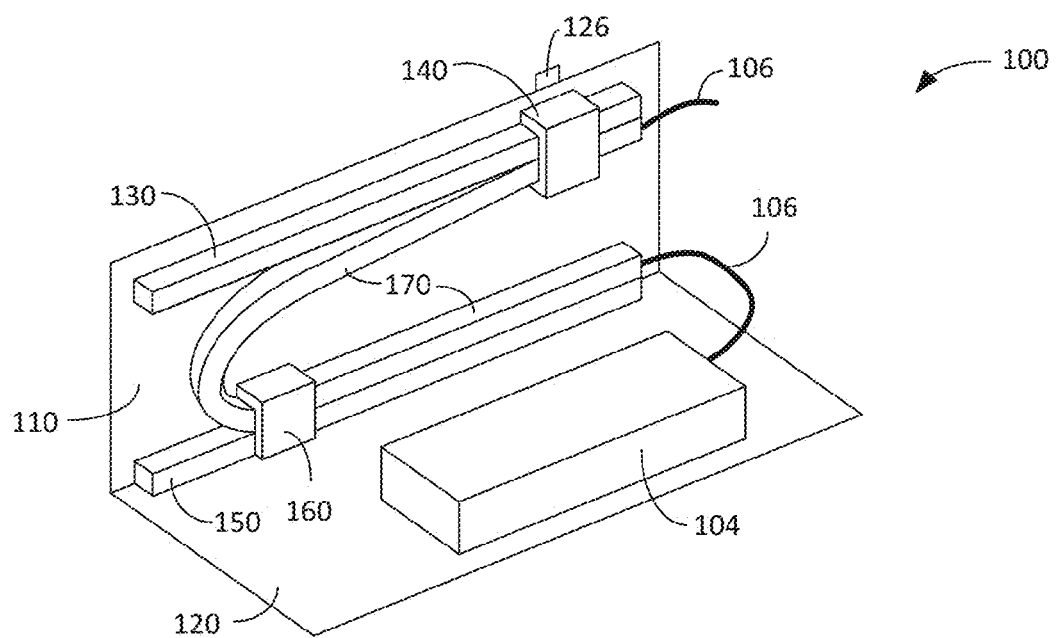
FIG. 4A is a perspective view of another exemplary cable management system used with a device holding apparatus, when the device holding apparatus is in a closed position.
Figure 4B:
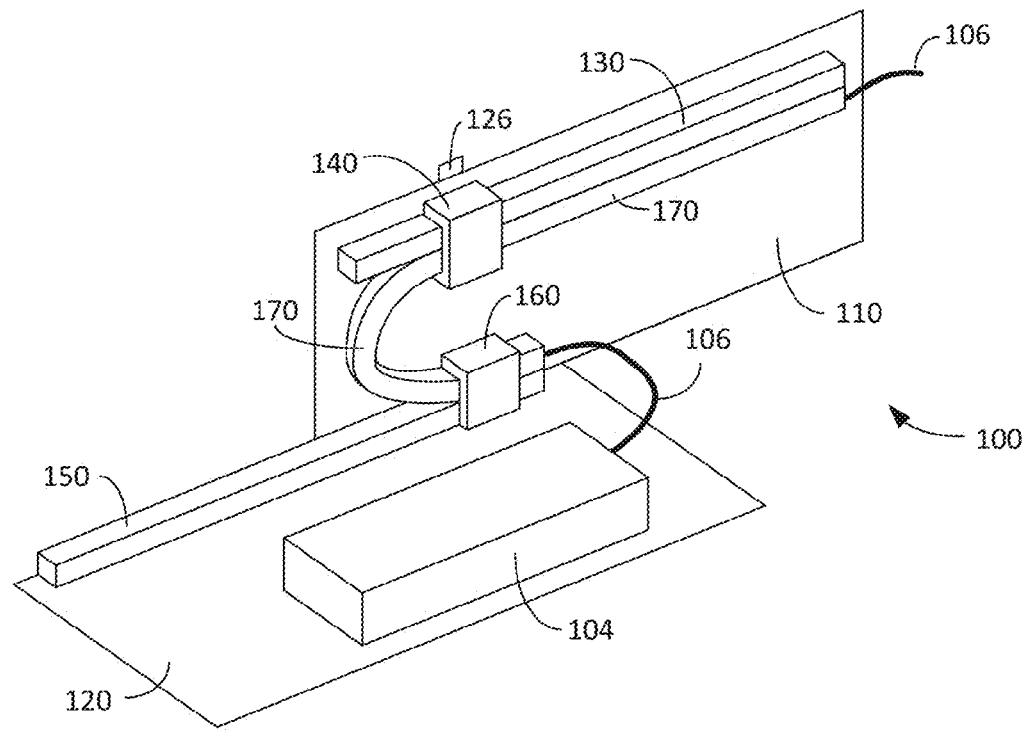
FIG. 4B is a perspective view of the cable management system of FIG. 4A when the device holding apparatus is in an open position.

The chassis track 130 and device holding apparatus track 150 may be a variety of shapes and sizes and positioned in a variety of different ways. In one or more embodiments, the chassis track 130 and the device holding apparatus track 150 may be positioned within a substantially horizontal plane (e.g., parallel to a ground surface) or a substantially vertical plane (e.g., perpendicular to a ground surface). For example, a horizontal plane relative to a ground surface is shown in FIGS. 2A and 2B and a vertical plane relative to a ground surface is shown in FIGS. 4A and 4B. In one or more embodiments, the chassis track 130 may be parallel to the device holding apparatus track 150. For example, as shown in FIG. 3A, the chassis track 130 may extend along a chassis track axis 134 from the first chassis track end region 131 to the second chassis track end region 132 and the device holding apparatus track 150 may extend along a device holding apparatus track axis 154 from the first holding track end region 151 to the second holding track end region 152, and the chassis track axis 134 may be parallel to the device holding apparatus track axis 154. In one or more embodiments, the chassis track length 136 is equal to the holding track length 156.

When the device holding apparatus 120 is in the closed position and the chassis track axis 134 and the device holding apparatus track axis 154 are parallel, the first chassis track end region 131 may be perpendicularly aligned (e.g., perpendicular to the chassis track axis 134/device holding apparatus track axis 154) with the first holding track end region 151, the second chassis track end region 132 may be perpendicularly aligned (e.g., perpendicular to the chassis track axis 134/device holding apparatus track axis 154) with the second holding track end region 152, or both the first and second chassis track end regions 131, 132 may be perpendicularly aligned (e.g., perpendicular to the chassis track axis 134/device holding apparatus track axis 154) with the first and second holding track end regions 151, 152, respectively (e.g., as shown in FIG. 3A).

As described herein, the cable management system 100 also includes a cable carrier 170 that is configured to carry one or more cables (e.g., cable 106 as shown in FIGS. 2-4). The cable carrier 170 may be any suitable shape or size to guide or direct the one or more cables. For example, the cable carrier 170 may be described as being tubular, hollow, enclosing, open along the length, etc. Further, for example, the cable carrier 170 may be described as defining a passageway 179 configured to receive, or hold, the one or more cables (e.g., the one or more cables may be at least partially located in the passageway 179). The cable carrier 170 may include (e.g., be formed of, etc.) any suitable material, e.g., fabricated out of an electrostatic discharge controlled cloth, any flexible material, etc.

More specifically, to carry the cable, the cable carrier 170 may be described as extending from a first cable carrier end region 171 to a second cable carrier end region 172 and defining a passageway 179 extending from the first cable carrier end region 171 to the second cable carrier end region 172 (e.g., the passageway 179 may extend between an opening proximate the first cable carrier end region 171 and another opening proximate the second cable carrier end region 172). The cable carrier 170 may be configured to carry the one or more cables through the passageway 179 from the first cable carrier end region 171 to the second cable carrier end region 172. In one or more embodiments, the one or more cables may enter/exit the cable carrier 170 at a location that is along the cable carrier 170 and not proximate the first or second cable carrier end regions 171, 172. For example, any portion(s) of the one or more cables may enter/exit the cable carrier 170 at a location between the first and second cable carrier end regions 171, 172. Additionally, a first or second portion of the one or more cables may enter/exit the cable carrier 170 at any combination of the locations along the cable carrier 170 as discussed herein. As shown in FIGS. 2-4, the cable carrier 170 defines openings at either end (e.g., proximate the first and second cable carrier end regions 171, 172) of the passageway 179 through which one or more cables enter/exit the cable carrier 170.

By positioning the one or more cables in the cable carrier 170, the one or more cables may maintain a relative position at each point in which the one or more cables enter/exit the cable carrier when the device holding apparatus 120 is in the open, or first, position and the closed, or second, position. Specifically, a first portion of the one or more cables may maintain a first position relative to the chassis 110 and a second portion of the one or more cables may maintain a second position relative to the device holding apparatus 120 when the device holding apparatus 120 is in both of the open and closed positions, and anywhere in between. Similarly, the first cable carrier end region 171 may maintain a first position relative to the chassis 110 and the second cable carrier end region 172 may maintain a second position relative to the device holding apparatus 120 when the device holding apparatus 120 is in the open and closed positions and all of the positions therebetween. For example, the first cable carrier end region 171 maintains a first position relative to the chassis 110 and the second cable carrier end region 172 maintains a second position relative to the device holding apparatus 120 when the device holding apparatus is in an intermediate position (e.g., as shown in FIG. 3B). Furthermore, in one or more embodiments, it may be described that the first position of the first cable carrier end region 171 may be closer to the second position of the second cable carrier end region 172 when the device holding apparatus 120 is in the closed position than when the device holding apparatus 120 is in the open position.

With the first cable carrier end region 171 maintaining a position relative to the chassis 110, a distance between the first cable carrier end region 171 and any other fixed portion of the chassis 110 may remain constant when the device holding apparatus 120 moves relative to the chassis 110 (e.g., between the open and closed positions). Therefore, a cable carried by the cable carrier 170 and extending between the first cable carrier end region 171 and any other fixed portion of the chassis 110 may not be stretched or "bunched up" when the device holding apparatus 120 moves relative to the chassis 110. Similarly, with the second cable carrier end region 172 maintaining a position relative to the device holding apparatus 120, a distance between the second cable carrier end region 172 and something positioned on the device holding apparatus 120 will remain constant when the device holding apparatus 120 moves relative to the chassis 110 (e.g., between the open and closed positions). Therefore, a cable carried by the cable carrier 170 and extending between the second cable carrier end region 172 and something positioned on the device holding apparatus 120 may not be stretched or "bunched up" when the device holding apparatus 120 moves relative to the chassis 110.

Further, the cable management system 100 may be described as helping maintain a position of the first and second cable carrier end regions 171, 172 relative to an edge of the chassis 110 and an edge of the device holding apparatus 120, respectively. In one or more embodiments, the chassis 110 extends from a first chassis edge 112 to a second chassis edge 114 along a first longitudinal axis 118 and the device holding apparatus 120 extends from a first holding apparatus edge 122 to a second holding apparatus edge 124 along a second longitudinal axis 128. The second holding apparatus edge 124 may be described as being closer to the second chassis edge 114 than the first chassis edge 112 when the device holding apparatus 120 is in the closed position and the second holding apparatus edge 124 may be described as being closer to the first chassis edge 112 than the second chassis edge 114 when the device holding apparatus 120 is in the open position. The first cable carrier end region 171 may be proximate the second chassis edge 114 and the second cable carrier end region 172 may be proximate the second holding apparatus edge 124 when the device holding apparatus 120 is in the open position, the closed position, and any position therebetween.

The cable carrier 170 may be further configured to engage and disengage at least portions of the chassis track 130 and the device holding apparatus track 150 to, e.g., properly position and manage the one or more cables that are being carried by the cable carrier 170 when the device holding apparatus 120 moves between the open and closed positions. The cable carrier 170 may also be described as being configured to be mated to and unmated from the chassis track 130 and the device holding apparatus track 150. More specifically, for example, the cable carrier 170 may be coupled to at least a portion of the chassis track 130 along the chassis track length 136 as the cable carrier 170 comes in contact with the chassis track 130 (e.g., when the device holding apparatus 120 moves from the closed position to the open position). Similarly, the cable carrier 170 may be coupled to at least a portion of the device holding apparatus track 150 along the holding track length 156 as the cable carrier 170 comes in contact with the device holding apparatus track 150 (e.g., when the device holding apparatus 120 moves from the open position to the closed position). In other words, as the cable carrier 170 and the chassis track 130/device holding apparatus track 150 are adjoined, those portions of the chassis track 130/device holding apparatus track 150 and the cable carrier 170 engage and, as a result, are coupled to one another (e.g., when the device holding apparatus 120 moves between the open and closed positions, and vice versa). As shown in FIGS. 2-4, the portions of the cable carrier 170 that are coupled to the chassis track 130 and the device holding apparatus track 150 may be different lengths of the cable carrier 170 and may be located at different portions of the cable carrier 170. Additionally, as the cable carrier 170 is separated from either the chassis track 130 or the device holding apparatus track 150, the cable carrier 170 is disengaged or uncoupled from the chassis track 130 or the device holding apparatus track 150.

The cable carrier 170 may be described as engaging different amounts of the chassis track 130 and the device holding apparatus track 150 as the device holding apparatus 120 is moved between the open position and the closed position, and vice versa. For example, the cable carrier 170 may be engaged to a portion of the chassis track 130 along at least half of the chassis track length 136 when the device holding apparatus 120 is in the open position. Conversely, for example, the cable carrier 170 may be engaged to any amount of the device holding apparatus track 150 along the holding track length 156 when the device holding apparatus 120 is in the open position. Additionally, for example, the cable carrier 170 may be engaged to a portion of the device holding apparatus track 150 along at least half of the holding track length 156 when the device holding apparatus 120 is in the closed position. Conversely, for example, the cable carrier 170 may be engaged to any amount of the chassis track 130 along the chassis track length 136 when the device holding apparatus 120 is in the closed position.

A length of the cable carrier 170 that is engaged to the chassis track 130 and the device holding apparatus track 150 may be equal in both of the open position and the closed position. In other words, a first length of the cable carrier 170 that is engaged to the chassis track 130 and the device holding apparatus track 150 when the device holding apparatus 120 is in the open position may be equal to a second length of the cable carrier 170 that is engaged to the chassis track 130 and the device holding apparatus track 150 when the device holding apparatus 120 is in the closed position. Further, as the cable carrier 170 engages a portion of the chassis track length 136, the cable carrier 170 may disengage an equal portion of the holding track length 156, and therefore, the cable carrier 170 may maintain an equal length in which the cable carrier 170 is engaged with the chassis track 130 and the device holding apparatus track 150. Similarly, as the cable carrier 170 engages a portion of the holding track length 156, the cable carrier 170 may disengage an equal portion of the chassis track length 136, and therefore, the cable carrier 170 may maintain an equal length in which the cable carrier 170 is engaged with the chassis track 130 and the device holding apparatus track 150.

In one or more embodiments, the cable carrier 170 may be described as engaging the chassis track 130 while simultaneously disengaging the device holding apparatus track 150, or vice versa. For example, a first length of the cable carrier 170 that is engaged to the chassis track 130 may increase while simultaneously a second length of the cable carrier 170 that is disengaged from the device holding apparatus track 150 may increase when the device holding apparatus 120 moves from the closed position to the open position.

The cable carrier 170 may be described as being engaged to a substantial portion of the device holding apparatus track 150 and minimally engaged to the chassis track 130 when the device holding apparatus 120 is in the closed position relative to the chassis 110 as shown in FIG. 3A. In one or more embodiments, the cable carrier 170 may completely disengage, or unmate, from the chassis track 130 when the device holding apparatus 120 is in the closed position. To facilitate such complete disengagement and subsequent engagement, the cable carrier 170 may be aligned such that the cable carrier 170 would be engaged, or mated, with the chassis track 130 when the device holding apparatus 120 is moved from the closed position to the open position.

Figure 3C:
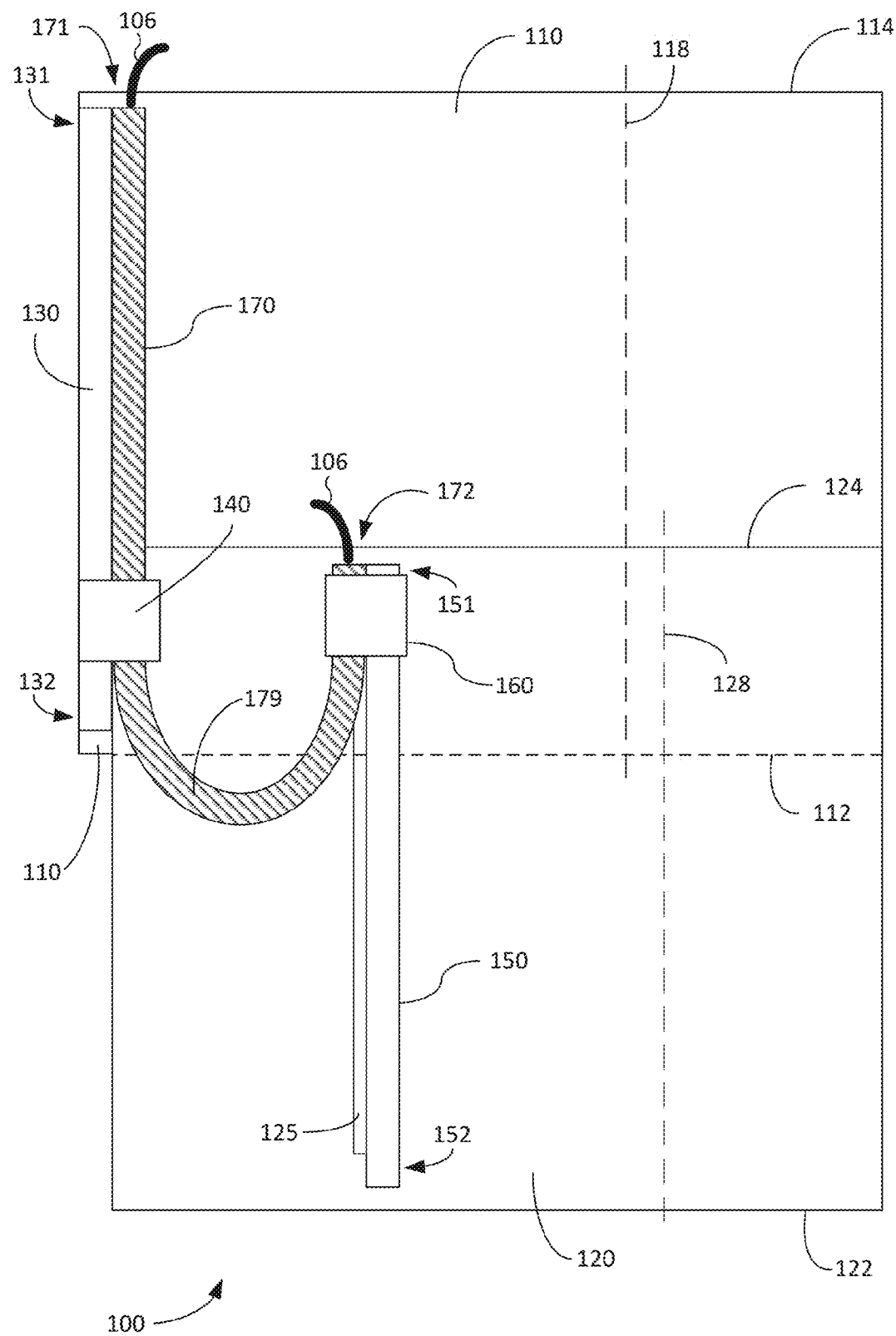
FIG. 3C is a top view of the cable management system of FIG. 2A when the device holding apparatus is in the open position.

The cable carrier 170 may be described as engaged to a substantial portion of the chassis track 130 and minimally engaged to the device holding apparatus track 150 when the device holding apparatus 120 is in the open position relative to the chassis 110 as shown in FIG. 3C. In one or more embodiments, the cable carrier 170 may completely disengage, or unmate, from the device holding apparatus track 150 when the device holding apparatus 120 is in the open position. To facilitate such complete disengagement and subsequent engagement, the cable carrier 170 would be aligned such that the cable carrier 170 would be engaged, or mated, with the device holding apparatus track 150 when the device holding apparatus 120 is moved from the open position to the closed position.

The cable carrier 170 may be engaged to the chassis track 130 and the device holding apparatus track 150 in any suitable way. Anything that allows the cable carrier 170 to be configured to engage and disengage the chassis track 130 to and from the device holding apparatus track 150 may be suitable to be used in, or by the exemplary cable management system described herein. In one or more embodiments, the cable carrier 170 may engage the chassis track 130 and the device holding apparatus track 150 using, e.g., a hook and loop fastener, an adhesive, a zipper, an interlocking groove and ridge, a cable binding scheme, etc., or any combination thereof.

As shown in FIGS. 2-5, the cable carrier 170 may be engaged to/disengaged from the chassis track 130 and the device holding apparatus track 150 using engagement elements. Specifically, a first engagement element 140 may be configured to engage/disengage the chassis track 130 to/from the cable carrier 170 and a second engagement element 160 may be configured to engage/disengage the device holding apparatus track 150 to/from the cable carrier 170. In at least one embodiment, the engagement elements may be described as "zipper feet."

The first engagement element 140 may be attached, or coupled, to the device holding apparatus 120. More specifically, the first engagement element 140 may be fixedly coupled to the device holding apparatus 120 such that the first engagement element 140 moves along with the device holding apparatus 120 when the device holding apparatus 120 moves relative to the chassis 110. The first engagement element 140 may be configured to engage the chassis track 130 to the cable carrier 170 when the device holding apparatus moves from the closed position to the open position and configured to disengage the chassis track 130 from the cable carrier 170 when the device holding apparatus 120 moves from the open position to the closed position.

The second engagement element 160 may be attached, or coupled, to the chassis 110. More specifically, the second engagement element 160 may be fixedly coupled to the chassis 110 such that the second engagement element 160 does not move along with the device holding apparatus 120 when the device holding apparatus 120 moves relative to the chassis 110. As shown in FIGS. 3A-3C, the device holding apparatus 120 is between the second engagement element 160 and the chassis 110, because of this, the device holding apparatus 120 may define an engagement slot 125 (e.g., an aperture in the device holding apparatus 120) through which the second engagement element 160 is attached to the chassis 110. The engagement slot 125 may provide access for the second engagement element 160 to remain coupled to the chassis 110 when the device holding apparatus 120 moves relative to the chassis 110. The second engagement element 160 may be configured to engage the device holding apparatus track 150 to the cable carrier 170 when the device holding apparatus 120 moves from the open position to the closed position and configured to disengage the device holding apparatus track 150 from the cable carrier 170 when the device holding apparatus 120 moves from the closed position to the open position.

In at least one embodiment, it may be described that when the device holding apparatus 120 is in the closed position (e.g., as shown in FIG. 3A), the first engagement element 140 is at a rear (e.g., the second chassis edge 114) of the chassis 110 and a small portion of the cable carrier 170 is engaged by the first engagement element 140 to the chassis track 130. As a result, the small portion of the cable carrier 170 may be "bound" to the device holding apparatus 120 and/or the chassis 110. In a complementary fashion, the second engagement element 160, which is fixed to the chassis 110, may fully engage the cable carrier 170 for a length of the device holding apparatus track 150 when the device holding apparatus 120 is in the closed position. As the device holding apparatus 120 moves from the closed position to the open position, the cable carrier 170 may be mated to the chassis track 130 as the cable carrier 170 is simultaneously unmated from the device holding apparatus track 150. When the device holding apparatus 120 is in the open position (e.g., as shown in FIG. 3C) the cable carrier 170 may be fully engaged with the chassis track 130 and a small portion of the cable carrier 170 may be engaged to the device holding apparatus track 150.

As described herein, the orientation of the chassis track 130 and the device holding apparatus track 150 as shown in FIGS. 2-3 is merely one embodiment and the exemplary cable management systems described herein may be oriented differently. For example, an exemplary embodiment of the chassis track 130 and the device holding apparatus track 150 oriented in a vertical plane relative to a ground surface is shown in FIGS. 4A-4B. A vertical orientation may lessen the amount of space taken up by the chassis track 130, the device holding apparatus track 150, and the cable carrier 170 by, e.g., positioning the chassis track 130, the device holding apparatus track 150, and the cable carrier 170 along a side of the device holding apparatus 120. As shown in FIGS. 4A-4B, the cable management system 100 includes a device holding apparatus extension 126 that is coupled to the device holding apparatus 120 and is configured to be fixedly coupled to the first engagement element 140, such that the first engagement element 140 moves along with the device holding apparatus 120 when the device holding apparatus 120 moves relative to the chassis 110.

In one or more embodiments, the cable carrier 170 may engage/disengage the chassis track 130 and the device holding apparatus track 150 through an exemplary zipper mechanism.

Each of the chassis track 130, the device holding apparatus track 150, and the cable carrier 170 may include zipper teeth along the length of at least one edge and each of the first and second engagement elements 140, 160 may include a zipper slider that is configured to engage and disengage zipper teeth of the chassis track 130, the device holding apparatus track 150, and the cable carrier 170. Specifically, the zipper slider may engage two lengths of zipper teeth (e.g., of the cable carrier 170 and the chassis track 130 or of the cable carrier 170 and the device holding apparatus track 150) when moved in a first direction and the zipper slider may disengage the same two lengths of zipper teeth when moved in a second direction that is generally opposite the first direction. In at least one embodiment, it may be described that the cable carrier 170 bears one half of a zipper track, and the complementary halves of the zipper track are resident on the chassis track 130 and/or the device holding apparatus track 150.

The zipper slider of the first engagement element 140 may be configured to engage the zipper teeth of the chassis track 130 to the zipper teeth of the cable carrier 170 and the zipper slider of the second engagement element 160 may be configured to engage the zipper teeth of the device holding apparatus track 150 to the zipper teeth of the cable carrier 170. Conversely, the zipper slider of the first engagement element 140 may be configured to disengage the zipper teeth of the chassis track 130 from the zipper teeth of the cable carrier 170 and the zipper slider of the second engagement element 160 may be configured to disengage the zipper teeth of the device holding apparatus track 150 from the zipper teeth of the cable carrier 170.

In another embodiment, each of the chassis track 130, the device holding apparatus track 150, and the cable carrier 170 may include zipper teeth along the length of two edges. For example, the cable carrier 170 may have zipper teeth along the length of two edges such that the zipper teeth of the chassis track 130 engage with the zipper teeth along one of the two edges of the cable carrier 170 and the zipper teeth of the device holding apparatus track 150 engage with the zipper teeth along the other of the two edges of the cable carrier 170. The use of zipper teeth along multiple edges of the cable carrier 170 may allow a different zipper pitch to be used on each edge and help aid correct orientation. For example, the zipper teeth of the cable carrier 170 along a first edge may only engage with the zipper teeth of the chassis track 130 and the zipper teeth of the cable carrier 170 along a second edge may only engage with the zipper teeth of the device holding apparatus track 150.

Figure 5:
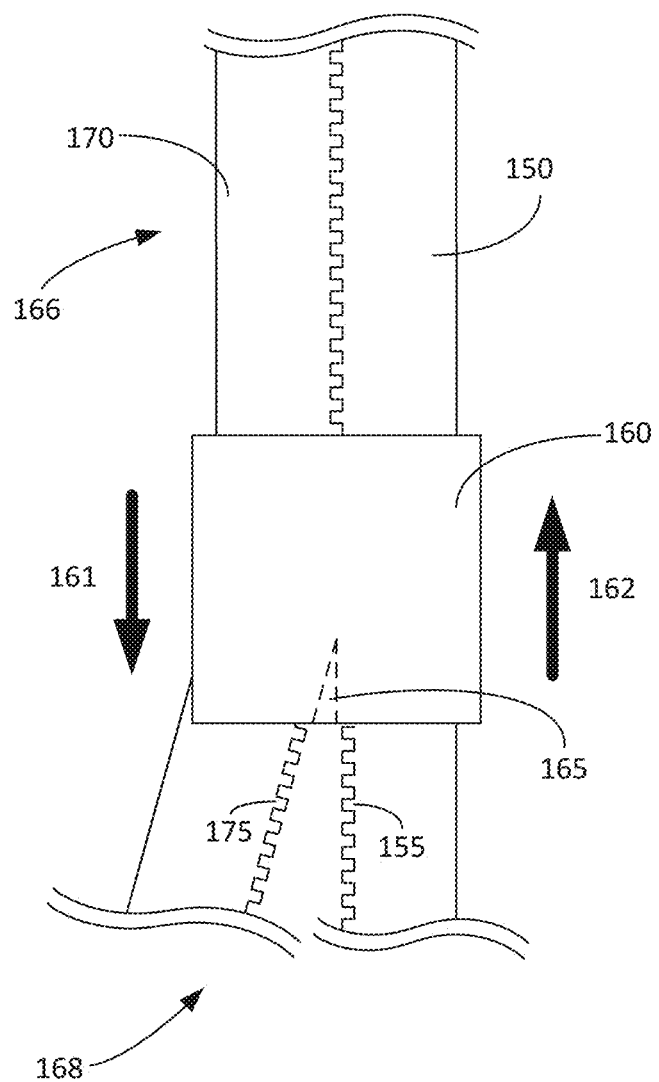
FIG. 5 is an enlarged top view of an exemplary engagement element of the cable management system of FIGS. 2-4.

A close-up of an exemplary embodiment of the second engagement element 160 coupling the cable carrier 170 to the device holding apparatus track 150 is shown in FIG. 5. Cable carrier 170 may include cable carrier zipper teeth 175, the device holding apparatus track 150 may include holding track zipper teeth 155, and the second engagement element 160 may include a zipper slider 165 that is configured to engage and disengage the holding track zipper teeth 155 to and from the cable carrier zipper teeth 175. For example, as shown in FIG. 5, at least a portion 166 of the holding track zipper teeth 155 are engaged, or coupled, to the cable carrier zipper teeth 175 and at least a portion 168 of the holding track zipper teeth 155 are disengaged, or uncoupled, from the cable carrier zipper teeth 175. The zipper slider 165 of the second engagement element 160 is configured to engage the cable carrier zipper teeth 175 to the holding track zipper teeth 155 when moved in a first direction 161 and the zipper slider 165 of the second engagement element 160 is configured to disengage the cable carrier zipper teeth 175 from the holding track zipper teeth 155 when moved in a second direction 162. Additionally, it is to be understood that the first engagement element 140 may be configured to operate similar to the second engagement element 160, but with respect to the chassis track 130 and the cable carrier 170.

In the preceding description, reference is made to the accompanying set of drawings that form a part hereof and in which are shown by way of illustration several specific embodiments. It is to be understood that other embodiments are contemplated and may be made without departing from (e.g., still falling within) the scope or spirit of the present disclosure. The preceding detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

It is noted that terms such as "top," "bottom," "above," below," etc. may be used in this disclosure. These terms should not be construed as limiting the position or orientation of a structure, but should be used as providing spatial relationship between the structures.

Embodiments of the systems, apparatus, and devices are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A cable management system comprising:
a device holding apparatus track coupled to a device holding apparatus and extending from a first holding track end region to a second holding track end region defining a holding track length, the device holding apparatus movably coupled to a chassis and movable between a first position and a second position;
a chassis track coupled to the chassis and extending from a first chassis track end region to a second chassis track end region defining a chassis track length;
a cable carrier extending from a first cable carrier end region to a second cable carrier end region and configured to carry a cable from the first cable carrier end region to the second cable carrier end region, the cable carrier engaged to a portion of the chassis track along at least half of the chassis track length when the device holding apparatus is in the first position, the cable carrier engaged to a portion of the device holding apparatus track along at least half of the holding track length when the device holding apparatus is in the second position;
a first engagement element attached to the device holding apparatus and configured to engage the chassis track to the cable carrier when the device holding apparatus moves from the second position to the first position and disengage the chassis track from the cable carrier when the device holding apparatus moves from the first position to the second position; and
a second engagement element attached to the chassis and configured to engage the device holding apparatus track to the cable carrier when the device holding apparatus moves from the first position to the second position and disengage the device holding apparatus track from the cable carrier when the device holding apparatus moves from the second position to the first position.

2. The cable management system of claim 1, wherein the first cable carrier end region maintains a first position relative to the chassis and the second cable carrier end region maintains a second position relative to the device holding apparatus when the device holding apparatus is in the first and second positions.

3. The cable management system of claim 1, the chassis extending from a first chassis edge to a second chassis edge along a first longitudinal axis, the device holding apparatus extending from a first holding apparatus edge to a second holding apparatus edge along a second longitudinal axis, the second holding apparatus edge being closer to the second chassis edge than the first chassis edge when the device holding apparatus is in the second position, the second holding apparatus edge being closer to the first chassis edge than the second chassis edge when the device holding apparatus is in the first position, the first cable carrier end region proximate the second chassis edge and the second cable carrier end region proximate the second holding apparatus edge when the device holding apparatus is in the first and second positions.

4. The cable management system of claim 1, each of the chassis track, device holding apparatus track, and cable carrier comprising zipper teeth, each of the first and second engagement elements comprising a zipper slider, the zipper slider of the first engagement element configured to engage and disengage the zipper teeth of the chassis track to and from, respectively, the zipper teeth of the cable carrier and the zipper slider of the second engagement element configured to engage and disengage the zipper teeth of the device holding apparatus track to and from, respectively, the zipper teeth of the cable carrier.

5. The cable management system of claim 1, a first length of the cable carrier engaged to the chassis track and device holding apparatus track when the device holding apparatus is in the first position being equal to a second length of the cable carrier engaged to the chassis track and device holding apparatus track when the device holding apparatus is in the second position.

6. The cable management system of claim 1, the chassis track extending along a chassis track axis from the first chassis track end region to the second chassis track end region, the device holding apparatus track extending along a device holding apparatus track axis from the first holding track end region to the second holding track end region, the chassis track axis being parallel to the device holding apparatus track axis.

7. The cable management system of claim 1, the chassis track length being equal to the holding track length.

8. The cable management system of claim 1, a first length of the cable carrier that is engaged to the chassis track increases while a second length of the cable carrier that is disengaged from the device holding apparatus track simultaneously increases when the device holding apparatus moves from the second position to the first position.

9. An apparatus comprising:
a data storage device holder movably coupled to a chassis and movable between an open position and a closed position, at least a portion of the data storage device holder located farther from the chassis in the open position than in the closed position;
a data storage device holder track coupled to the data storage device holder;
a chassis track coupled to the chassis;
a cable carrier extending from a first cable carrier end region to a second cable carrier end region and configured to carry a cable from the first cable carrier end region to the second cable carrier end region, the cable carrier configured to engage at least a portion of the chassis track when the data storage device holder is in the open position and at least a portion of the data storage device holder track when the data storage device holder is in the closed position, the first cable carrier end region maintaining a first position relative to the chassis and the second cable carrier end region maintaining a second position relative to the data storage device holder when the data storage device holder moves between and is in the open and closed positions, the first cable carrier end region being closer to the second cable carrier end region when the data storage device holder is in the closed position than when the data storage device holder is in the open position;
a first engagement element attached to the data storage device holder and configured to engage the chassis track to the cable carrier when the data storage device holder moves from the closed position to the open position and disengage the chassis track from the cable carrier when the data storage device holder moves from the open position to the closed position; and
a second engagement element attached to the chassis and configured to engage the data storage device holder track to the cable carrier when the data storage device holder moves from the open position to the closed position and disengage the data storage device holder track from the cable carrier when the data storage device holder moves from the closed position to the open position.

10. The apparatus of claim 9, each of the chassis track, data storage device holder track, and cable carrier comprising zipper teeth, each of the first and second engagement elements comprising a zipper slider, the zipper slider of the first engagement element configured to engage and disengage the zipper teeth of the chassis track to and from, respectively, the zipper teeth of the cable carrier and the zipper slider of the second engagement element configured to engage and disengage the zipper teeth of the data storage device holder track to and from, respectively, the zipper teeth of the cable carrier.

11. The apparatus of claim 9, a first length of the cable carrier engaged to the chassis track and data storage device holder track when the data storage device holder is in the open position being equal to a second length of the cable carrier engaged to the chassis track and data storage device holder track when the data storage device holder is in the closed position.

12. The apparatus of claim 9, the chassis track length being equal to the holding track length.

13. The apparatus of claim 9, a first length of the cable carrier that is engaged to the chassis track increases while a second length of the cable carrier that is disengaged from the data storage device holder track simultaneously increases when the data storage device holder moves from the closed position to the open position.

14. A method for managing cable comprising:
providing a device holding apparatus track coupled to a device holding apparatus and a chassis track coupled to a chassis;
providing a cable carrier extending from a first cable carrier end region to a second cable carrier end region and configured to carry a cable from the first cable carrier end region to the second cable carrier end region, at least a portion of the device holding apparatus located farther from the chassis in an open position than in a closed position;
increasing a first length of the cable carrier that is engaged to the chassis track when the device holding apparatus moves from the closed position to the open position;
simultaneously increasing a second length of the cable carrier that is disengaged from the device holding apparatus track when the device holding apparatus moves from the closed position to the open position;
engaging the chassis track to the cable carrier using a first engagement element attached to the device holding apparatus when the device holding apparatus moves from the closed position to the open position;
disengaging the chassis track from the cable carrier using the first engagement element when the device holding apparatus moves from the open position to the closed position;
engaging the device holding apparatus track to the cable carrier using a second engagement element attached to the chassis when the device holding apparatus moves from the open position to the closed position; and
disengaging the device holding apparatus track from the cable carrier using the second engagement element when the device holding apparatus moves from the closed position to the open position.

15. The method for managing cable of claim 14, further comprising:

decreasing the first length of the cable carrier that is engaged to the chassis track when the device holding apparatus moves from the open position to the closed position; and simultaneously decreasing the second length of the cable carrier that is disengaged from the device holding apparatus track when the device holding apparatus moves from the open position to the closed position.

16. The method for managing cable of claim 14, each of the chassis track, device holding apparatus track, and cable carrier comprising zipper teeth, each of the first and second engagement elements comprising a zipper slider, the zipper slider of the first engagement element configured to engage and disengage the zipper teeth of the chassis track to and from, respectively, the zipper teeth of the cable carrier and the zipper slider of the second engagement element configured to engage and disengage the zipper teeth of the device holding apparatus track to and from, respectively, the zipper teeth of the cable carrier.

* * * * *